(12) United States Patent
Chumakov

(10) Patent No.: US 8,546,915 B2
(45) Date of Patent: Oct. 1, 2013

(54) INTEGRATED CIRCUITS HAVING PLACE-EFFICIENT CAPACITORS AND METHODS FOR FABRICATING THE SAME

(75) Inventor: Dmytro Chumakov, Dresden (DE)

(73) Assignee: GLOBLFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/542,561

(22) Filed: Jul. 5, 2012

(65) Prior Publication Data
US 2012/0267763 A1   Oct. 25, 2012

Related U.S. Application Data

(62) Division of application No. 13/022,416, filed on Feb. 7, 2011, now Pat. No. 8,236,645.

(51) Int. Cl.
*H01L 21/02* (2006.01)
(52) U.S. Cl.
USPC ............... 257/534; 361/303; 257/E27.025; 257/E21.018
(58) Field of Classification Search
USPC ............... 257/301–303, 528–534, E21.011, 257/E21.012, E21.018–E21.021, E27.025; 438/239, 250, 381, 383–399; 361/271–330
See application file for complete search history.

(56) References Cited

U.S. PATENT DOCUMENTS

| | | | |
|---|---|---|---|
| 1,290,799 A | 1/1919 | Talley | |
| 1,513,766 A | 11/1924 | Spooner | |
| 1,739,112 A | 12/1929 | Wisbrod | |
| 3,179,553 A | 4/1965 | Franklin | |
| 3,563,836 A | 2/1971 | Dunbar | |
| 3,813,281 A | 5/1974 | Burgess et al. | |
| 3,829,899 A | 8/1974 | Davis | |
| 3,867,239 A | 2/1975 | Alesi et al. | |
| 3,962,976 A | 6/1976 | Kelsey | |
| 3,977,294 A | 8/1976 | Jahn | |
| 4,292,375 A | 9/1981 | Ko | |
| 4,307,140 A | 12/1981 | Davis | |
| 4,323,000 A | 4/1982 | Dennis et al. | |
| 4,476,660 A | 10/1984 | Francovitch | |
| 4,633,756 A | 1/1987 | Rudoi | |
| 4,648,136 A | 3/1987 | Higuchi | |
| 4,739,690 A | 4/1988 | Moskowitz | |

(Continued)

FOREIGN PATENT DOCUMENTS

JP   06-204428 H   7/1994
KR   10-0698089   3/2007

OTHER PUBLICATIONS

Office Action issued in Korean Patent Application No. 10-2011-0099266 dated Jun. 18, 2013.

*Primary Examiner* — Fernando L Toledo
*Assistant Examiner* — Victoria K Hall
(74) *Attorney, Agent, or Firm* — Ingrassia Fisher & Lorenz, P.C.

(57) ABSTRACT

An integrated circuit having a place-efficient capacitor includes a lower capacitor electrode having a surface area comprised of an inner surface area of a partial opening and a via opening formed in a patterned dielectric layer on a semiconductor substrate, a capacitor insulating layer overlying the lower capacitor electrode, and an upper capacitor electrode including a metal fill material filling the partial opening and the via opening and having a surface area that includes the inner surface area of the partial opening and via opening.

13 Claims, 6 Drawing Sheets

(56) References Cited

U.S. PATENT DOCUMENTS

| | | |
|---|---|---|
| 4,744,187 A | 5/1988 | Tripp |
| 4,868,040 A | 9/1989 | Hallal et al. |
| 4,895,063 A | 1/1990 | Marlow et al. |
| 4,911,061 A | 3/1990 | Pivitt et al. |
| 4,928,575 A | 5/1990 | Smirlock et al. |
| 4,945,814 A | 8/1990 | Huet |
| 4,948,673 A | 8/1990 | Goeury |
| 4,953,442 A | 9/1990 | Bartuski |
| 4,965,138 A | 10/1990 | Gonzalez |
| 4,987,033 A | 1/1991 | Abkowitz et al. |
| 5,014,592 A | 5/1991 | Zweig et al. |
| 5,164,536 A | 11/1992 | Barbaza et al. |
| 5,170,690 A | 12/1992 | Smirlock et al. |
| 5,191,166 A | 3/1993 | Smirlock et al. |
| 5,196,252 A | 3/1993 | Harpell |
| 5,200,256 A | 4/1993 | Dunbar |
| 5,254,383 A | 10/1993 | Harpell et al. |
| 5,326,606 A | 7/1994 | Labock |
| 5,333,532 A | 8/1994 | Smirlock et al. |
| 5,361,678 A | 11/1994 | Roopchand et al. |
| 5,402,703 A | 4/1995 | Drotleff |
| 5,453,633 A | 9/1995 | Yun |
| 5,469,773 A | 11/1995 | Tarpinian |
| 5,480,706 A | 1/1996 | Li et al. |
| 5,515,541 A | 5/1996 | Sacks et al. |
| 5,560,971 A | 10/1996 | Emery |
| 5,635,288 A | 6/1997 | Park |
| 5,686,689 A | 11/1997 | Snedeker et al. |
| 6,043,119 A * | 3/2000 | Wu et al. ............... 438/254 |
| 6,204,141 B1 * | 3/2001 | Lou ............... 438/386 |
| 6,291,289 B2 * | 9/2001 | Rhodes et al. ............... 438/239 |
| 6,418,832 B1 | 7/2002 | Colvin |
| 6,532,857 B1 | 3/2003 | Shih et al. |
| 6,548,348 B1 * | 4/2003 | Ni et al. ............... 438/253 |
| 6,583,461 B2 * | 6/2003 | Yokoyama et al. ............... 257/301 |
| 6,787,839 B2 * | 9/2004 | Wu et al. ............... 257/306 |
| 6,912,944 B2 | 7/2005 | Lucuta et al. |
| 8,258,039 B2 * | 9/2012 | Inoue ............... 438/386 |
| 2002/0153554 A1 * | 10/2002 | Kajita et al. ............... 257/306 |
| 2006/0102983 A1 * | 5/2006 | Iijima ............... 257/532 |
| 2007/0155091 A1 | 7/2007 | Park |
| 2007/0200197 A1 * | 8/2007 | Torres et al. ............... 257/516 |
| 2008/0308854 A1 * | 12/2008 | Takaishi ............... 257/304 |
| 2011/0073988 A1 * | 3/2011 | Burke et al. ............... 257/531 |

* cited by examiner

INTEGRATED CIRCUITS HAVING PLACE-EFFICIENT CAPACITORS AND METHODS FOR FABRICATING THE SAME

CROSS-REFERENCE TO RELATED APPLICATION

This application is a divisional of U.S. patent application Ser. No. 13/022,416, entitled "INTEGRATED CIRCUITS HAVING PLACE-EFFICIENT CAPACITORS AND METHODS FOR FABRICATING THE SAME," filed on Feb. 7, 2011, which is incorporated by reference herein in its entirety.

FIELD OF THE INVENTION

The present invention generally relates to integrated circuits and methods for fabricating integrated circuits, and more particularly relates to integrated circuits having place-efficient capacitors and methods for fabricating the same.

BACKGROUND OF THE INVENTION

During front end-of-the-line processing, a plurality of semiconductor devices (e.g., transistors, resistors, and the like) are formed on a semiconductor wafer. During back end-of-the-line (BEOL) processing, a plurality of semiconductor devices are interconnected to form a plurality of integrated circuits on the wafer, which are subsequently separated into individual die during wafer dicing. Interconnection of the semiconductor devices is accomplished via the formation of a plurality of BEOL layers, which include, in part, a number of metallization layers and a number of interlayer dielectric layers (ILD layers).

Capacitors are used in many electrical and electronic devices to implement a wide variety of functions. Capacitors may be fabricated as part of the back-end-of-the-line (BEOL) process. BEOL begins when a first metallization layer is deposited on the semiconductor wafer. Back end capacitors typically require a large amount of chip area and often compete for available chip area in which transistors can be formed.

There is a continual interest in the integration density of semiconductor devices, such as capacitors, etc. on the integrated circuit. High capacitance is desired for capacitors, including DRAM storage capacitors. "Capacitance" refers to the capacity of the device for storing electric charge. One approach to increase the capacitance is to increase the area of the capacitor electrodes. Capacitance is directly proportional to the surface area of the electrodes. However, this approach results in an increase in the actual area occupied by the capacitor on the integrated circuit or an increase in the size of the chip (the integrated circuit). Neither of these options is desirable as increasing the actual area occupied by the capacitor excludes other semiconductor devices and an increase in the chip size undermines the interest toward integration density.

Accordingly, it is desirable to provide integrated circuits having a capacitor with increased capacitance per unit area (i.e., a "place-efficient capacitor") and methods for fabricating the same. It is also desired to increase the capacitance of the capacitor without occupying more chip space or increasing the size of the integrated circuit to enable an increase in the number of semiconductor devices integrated on a given area of the integrated circuit. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for fabricating integrated circuits having place-efficient capacitors are provided. In accordance with one exemplary embodiment, the method includes forming a dielectric layer overlying a conductive feature on a semiconductor substrate. A via opening is formed into the dielectric layer to expose a portion of the conductive feature. A partial opening is etched into the dielectric layer and positioned over the conductive feature. Etch resistant particles are deposited overlying the dielectric layer and in the partial opening. The dielectric layer is further etched using the etch resistant particles as an etch mask to extend the partial opening. A first conductive layer is formed overlying the extended partial opening and electrically contacting the conductive feature. A capacitor insulating layer is formed overlying the first conductive layer. A second conductive layer is formed overlying the insulating layer.

Methods for fabricating integrated circuits having place-efficient capacitors are provided in accordance with yet another exemplary embodiment of the present invention. The method includes forming a dielectric layer overlying a conductive feature on a semiconductor substrate. A via opening is formed in the dielectric layer to expose a portion of the conductive feature. The via opening is filled with an organic planarization layer (OPL) material. The dielectric layer is etched to form a partial opening positioned over the conductive feature. Etch-resistant particles are deposited over the dielectric layer in the partial opening. The dielectric layer is further etched around the etch-resistant particles to extend the partial opening forming an extended partial opening. The etch-resistant particles and the OPL material within the via opening are removed. A lower capacitor electrode is formed, for example from a metal liner, within the via opening and the extended partial opening. A capacitor insulating layer is formed overlying the metal liner. An upper capacitor electrode is formed filling the via opening and the extended partial opening with a metal fill material.

Integrated circuits having a place-efficient capacitor are provided in accordance with yet another exemplary embodiment of the present invention. The integrated circuit includes a lower capacitor electrode having a surface area that includes an inner surface area of an extended partial opening and a via opening formed in a patterned dielectric layer on a semiconductor substrate. A capacitor insulating layer overlies the lower capacitor electrode. An upper capacitor electrode metal fill material fills the extended partial opening and the via opening and has a surface area that includes the inner surface area of the extended partial opening and via opening.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Various embodiments are directed to integrated circuits having place-efficient capacitors and methods for fabricating the same. As used herein and noted previously, "place-efficient capacitors" are capacitors with increased capacitance per unit area. Etch-resistant particles are used as patterning agents to introduce porosity to a dielectric layer of the integrated circuit to increase the effective area between capacitor electrodes, thereby increasing the capacitor capacitance, without the capacitor occupying more area on the integrated circuit or increasing the size of the integrated circuit. A place-efficient capacitor frees up available space on the integrated circuit for other semiconductor devices, thereby improving the economics of integrated circuit fabrication.

Figure 1:
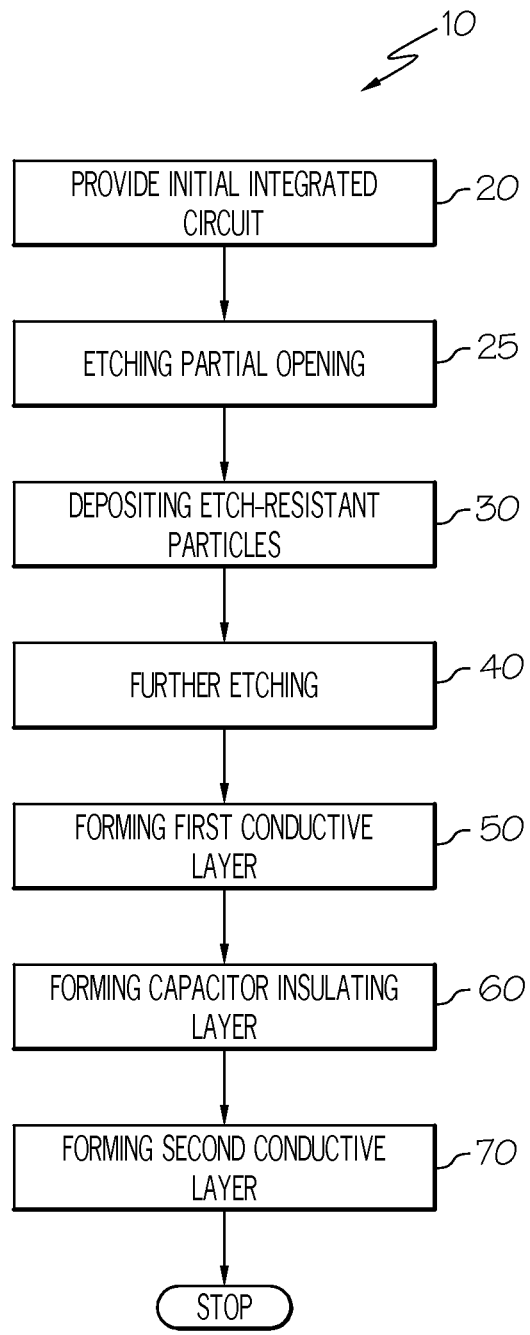
FIG. 1 is a flow diagram of a method for fabricating an integrated circuit, according to exemplary embodiments of the present invention.
Figure 2:
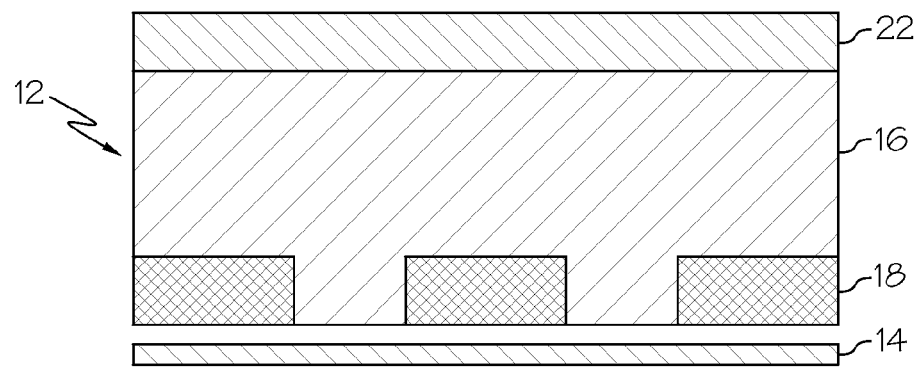
FIG. 2 illustrates, in cross-section, a portion of an exemplary initial integrated circuit.

Referring now to FIG. 1, a method 10 for fabricating an integrated circuit having a place-efficient capacitor begins by providing an integrated circuit 12 (step 20). The initial integrated circuit is made using standard semiconductor processing that is well known in the art. FIG. 2 illustrates an exemplary initial integrated circuit including a semiconductor substrate 14, a dielectric layer 16 on the semiconductor substrate (dielectric layer 16 is an interlayer dielectric (ILD)), at least one conductive feature 18 formed in the dielectric layer with the dielectric layer formed overlying the conductive feature, and a first photoresist layer 22 overlying a top surface of the dielectric layer for purposes as hereinafter described. The dielectric layer is formed of dielectric materials as well known in the art. For ease of illustration, the dielectric layer and first photoresist layer are each shown as a single layer, but it is to be understood that there may be additional dielectric and/or photoresist layers as well as other layers (not shown) such as, for example, anti-reflective coating (ARC) layers, organic planarization layers (OPL), or the like. The semiconductor substrate is made of a semiconductor material such as monocrystalline silicon, polycrystalline silicon, silicon-germanium, or the like and may include insulating layers, diffusion barrier layers, conductive layers, and the like as well as circuitry and other structures including one or more semiconductor devices such as transistors, capacitors, resistors, and the like (not shown). For simplicity, the semiconductor substrate will not be shown in subsequent drawings. The conductive feature may be formed from a metal such as copper, tungsten, aluminum, silver, gold, or other conductive metal, and the like. The conductive feature may be connected to other underlying features (not shown), such as other metal lines, vias, contact plugs, or silicide regions of MOS devices.

Figure 3:
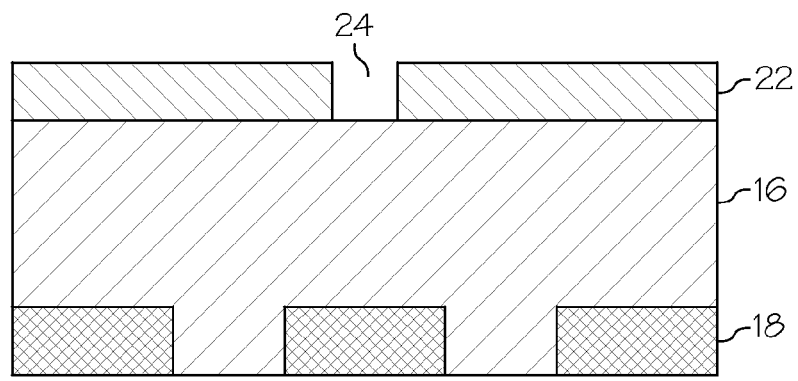
FIGS. 3 to 14 illustrate, in cross section, the initial integrated circuit matriculating through various stages of forming a place-efficient capacitor in a back end of line phase of an integrated circuit fabrication process.
Figure 4:
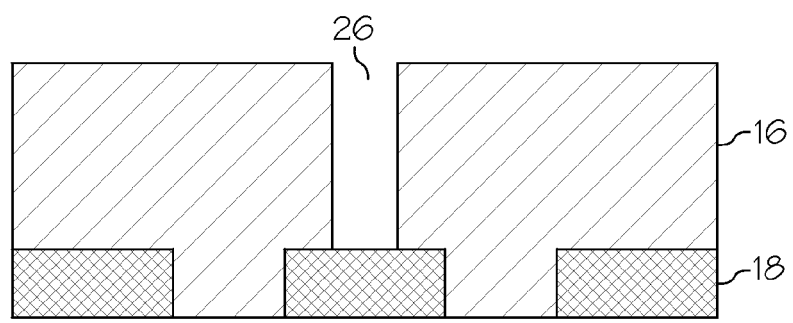

Referring to FIGS. 3 and 4, using known lithography processes, the first photoresist layer 22 is formed and patterned for a first opening 24 for an interconnect structure (e.g., a via) in the dielectric layer. A via opening 26 is formed in the dielectric layer where the place-efficient capacitor 48 (FIG. 14) is to be formed and to expose the conductive feature. The via opening is formed by etching the dielectric layer using an etching process such as, for example, a reactive ion etch (RIE). An etch stop layer, not illustrated, may be used to facilitate the etching of the via opening. Still referring to FIG. 4, the first photoresist layer is removed and the substrate is re-cleaned.

Figure 5:
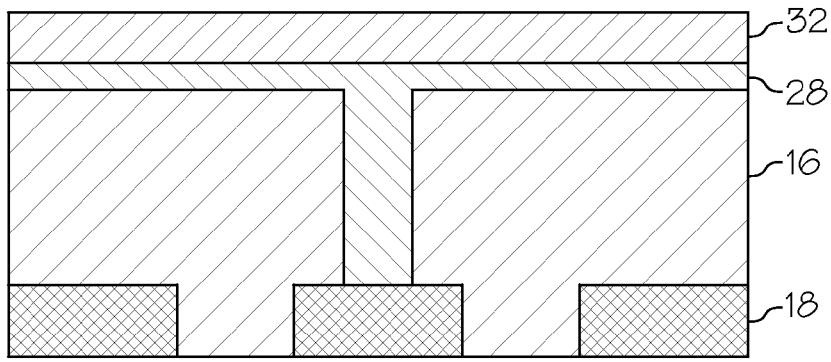
Figure 6:
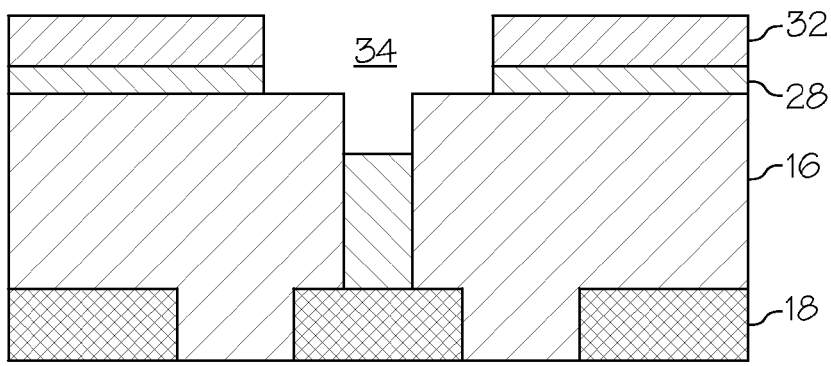
Figure 7:
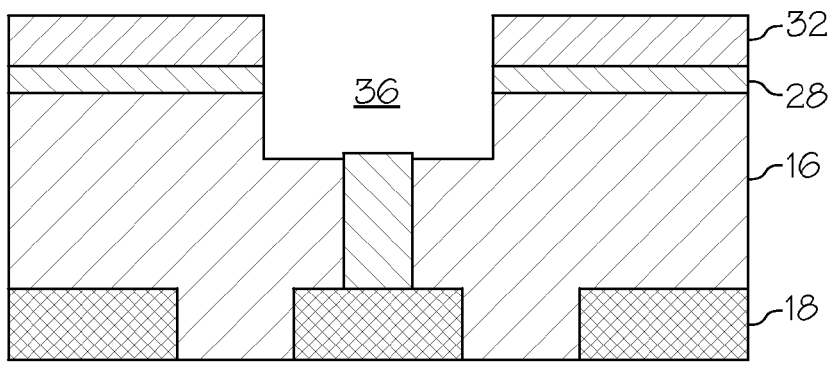

Referring now to FIGS. 5 through 7, an organic planarization layer (OPL) 28 is formed overlying the dielectric layer including filling the via opening 26. The OPL layer planarizes the top surface of the integrated circuit for a second photoresist layer 32 to be formed over a top surface of the organic planarization layer. Using known lithography processes, a second opening 34 is formed and patterned in the second photoresist and OPL layers (FIG. 6), thereby removing OPL material in an upper portion of the via opening. The OPL layer may be formed of known OPL materials.

Referring specifically to FIG. 7, a partial opening (e.g., a trench) 36 is etched into the dielectric layer and positioned over the conductive feature (step 25 in FIG. 1). The dielectric layer 16 is partially etched stopping just below the top surface of the dielectric layer to form the partial opening 36. The partial opening is formed at the top of the via opening and transverse thereto. The partial opening is formed where a subsequently-formed first conductive layer serves as a bottom capacitor electrode, as hereinafter described. The partial opening is anisotropically etched using, for example, $C_4F_6/Ar/O_2$ etch chemistry.

Figure 8:
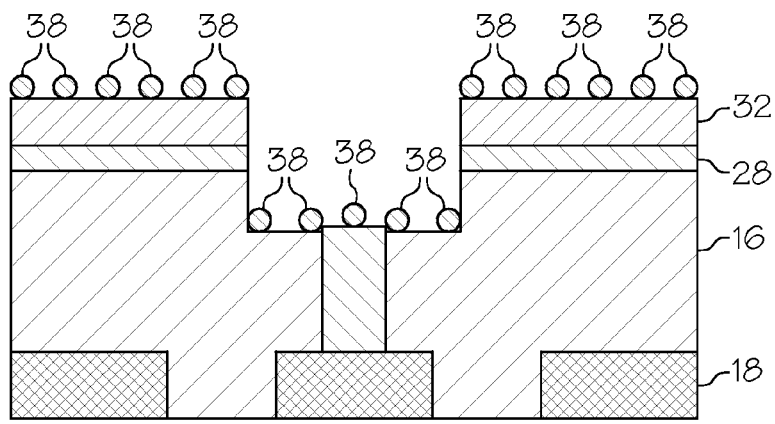

Referring now to FIG. 8, method 10 continues by depositing etch resistant particles 38 overlying the second photoresist layer 32 and the dielectric layer in the partial opening (step 30 in FIG. 1). The etch-resistant particles serve as a non-continuous etch resistant mask (i.e., a porosity mask) leaving space on the exposed top surface of the dielectric layer in the partial opening corresponding to locations where the underlying dielectric material is to be etched, as hereinafter described. In all other regions, the etch-resistant particles physically block the etchant. As used herein, the term "etch-resistant particles" refers to an etch-resistant porous layer or distributed particles. The etch-resistant porous layer may be a porous polymer layer (e.g., OPL-like materials with open porosity induced by methods well known in the art). The distributed particles may be organic or inorganic particles such as, for example, platinum (Pt), gold (Au), carbon (C), or combinations thereof. The organic and inorganic particles may be self-assembling. The organic and inorganic particles have a size range between about 2 nm to about 150 nm, preferably about 5 to about 70 nm. The organic and inorganic particles are deposited in a manner to distribute them substantially equally over about 20% to about 60% of the area. As used herein, "distribute" refers to spreading out or scattering. The pores of the porous layer are similarly distributed.

Figure 9:
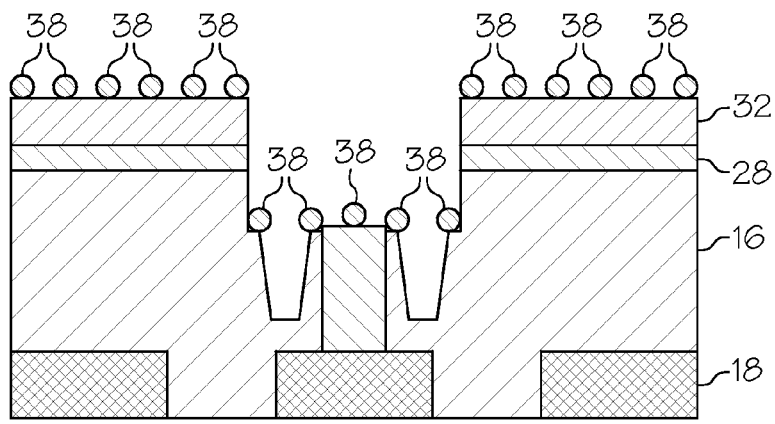
Figure 10:
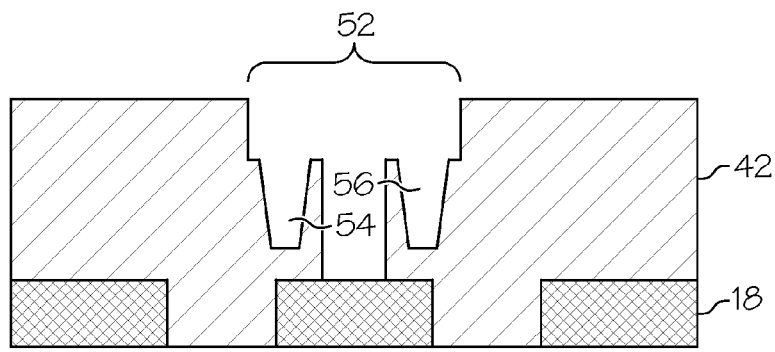

Referring to FIGS. 9 and 10, method 10 continues by further etching the dielectric layer using the etch resistant particles and the second photoresist layer as an etch mask to extend the partial opening deeper into the dielectric layer 16 forming an extended partial opening 52 (step 40 in FIG. 1). By etching the dielectric layer using the etch resistant particles as an etch mask, an irregular surface of increased surface area is created. The extended partial opening 52, as illustrated, includes at least first and second portions 54 and 56, separated by the via opening 26. Of course, depending on the density of the deposited etch resistant particles, other portions similar to portions 54 and 56 can be created forming an etch pattern. The etch-resistant particles can be smaller than the resolution limit of normal photolithography and consequently create an etched pattern having greater resolution than could be obtained by conventional photolithography. Etching around the etch-resistant particles is performed utilizing a wet etchant to extend the partial opening and increase the area thereof forming the extended partial opening, thereby increasing the effective area for metallization as hereinafter described. The material for the OPL layer in the via opening is selected to be substantially etch-resistant to the etchant selected to etch the dielectric layer. After completing the further etching step, the integrated circuit appears as illustrated in FIG. 9. The regions below the etch-resistant particles (i.e., in their shadow) are either not etched, or etched less intensively. The dielectric layer is etched around the etch-resistant particles to introduce porosity into the surface of the dielectric layer increasing the effective capacitor area without occupying more space on the integrated circuit. The etch pattern may be ideal, as shown in FIG. 9, or chaotic.

After the further etching step is completed, the etch-resistant particles, the residual second photoresist layer, and the OPL layer including within the via opening are removed to leave a patterned dielectric layer 42 that is roughened with increased surface area as illustrated in FIG. 10. As noted previously, the patterned dielectric layer has increased porosity and roughness and therefore an increased active area in the extended partial opening 52 and via opening relative to the pre-etched dielectric layer.

Figure 11:
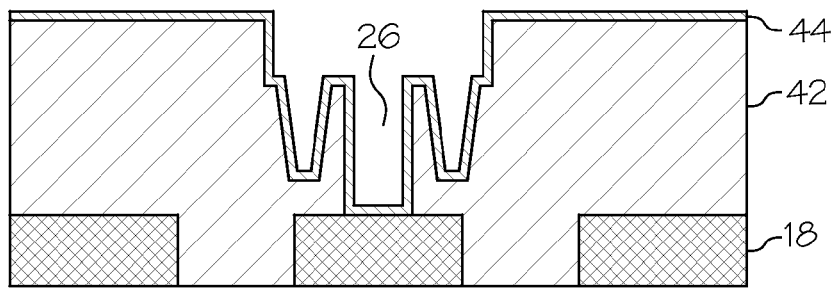

Referring now to FIG. 11, method 10 continues by forming a first conductive layer 44 overlying the dielectric layer including within the extended partial opening 52 and via opening 26 and contacting conductive feature 18 (step 50 in FIG. 1). The first conductive layer may be a diffusion barrier layer. The first conductive layer simultaneously serves as a metal liner for the partial opening (e.g., a trench) and via opening and will constitute a lower capacitor electrode 58 (See FIG. 14). The metal liner has a thickness of about 5 nm to about 20 nm, and is formed of a conductive material such as, for example, titanium, titanium-nitride, or the like. The surface area of the lower capacitor electrode includes the irregular surface area of the extended partial opening and the inner surface area of the via opening.

Figure 12:
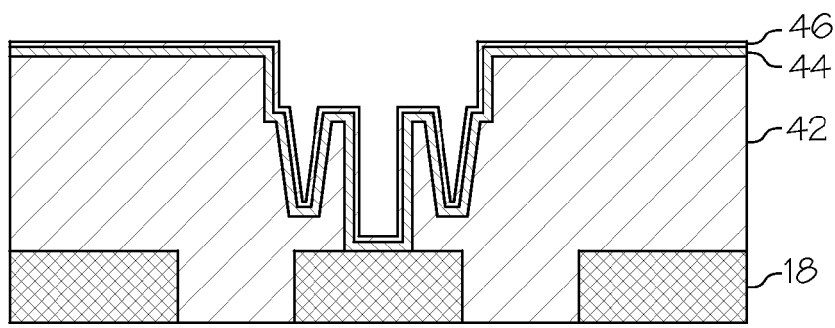

Referring to FIG. 12, method 10 continues with forming a capacitor insulating layer 46 overlying the first conductive layer 44 including within the extended partial opening and via opening (step 60 in FIG. 1). The capacitor insulating layer may be formed from insulators as known in the art. The place-efficient capacitor 48 (FIG. 14) includes the lower capacitor electrode and an upper capacitor electrode separated by the capacitor insulating layer, as hereinafter described.

Figure 13:
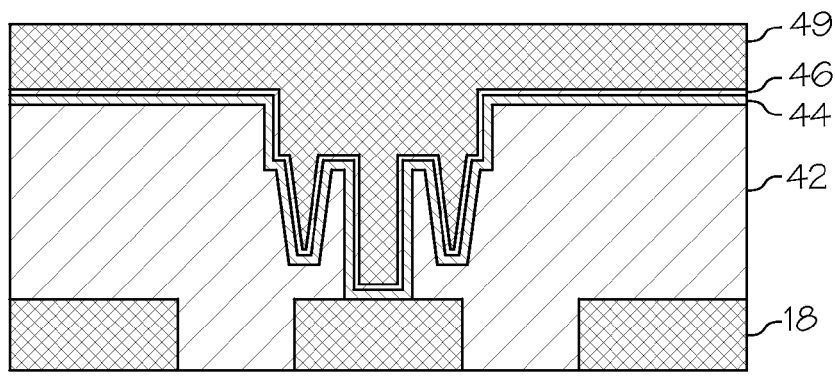
Figure 14:
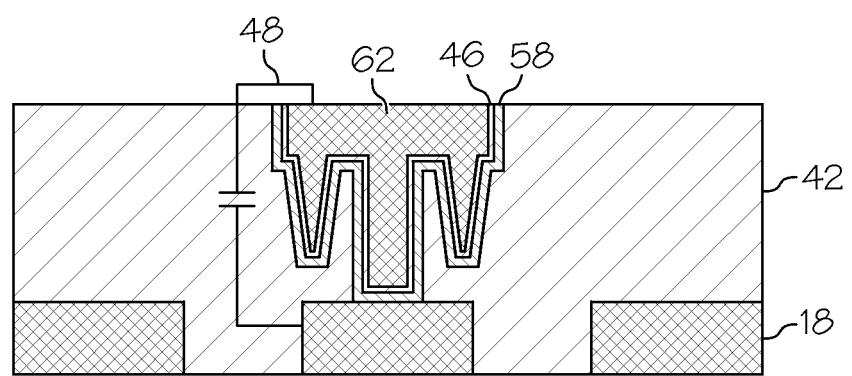

Referring to FIGS. 13 and 14, method 10 continues with forming a second conductive layer 49 overlying the capacitor insulating layer 46 including filling the extended partial opening and via opening (step 70 in FIG. 1). The second conductive layer is a metal layer formed of a metal fill material such as, for example, copper, tungsten, aluminum, silver, gold, and the like. For ease of illustration, the second conductive layer 49 is shown as a single layer, but it is to be understood that there may be additional metal layers that may be formed in multiple steps. The metal fill material in the extended partial opening and the via opening forms the upper plate of the capacitor (i.e., an upper capacitor electrode 62). The excess metal is removed, for example, by a chemical mechanical planarization (CMP) process as known in the art to remove metal overfill forming the upper capacitor electrode 62 of the place-efficient capacitor 48 (FIG. 14). As the surface area of the partial opening has been increased by use of the etch-resistant particles, the metallization area within the extended partial opening has been increased, thereby increasing the surface area of the lower and upper capacitor electrodes and increasing capacitor capacitance. The surface area of the upper capacitor electrode includes the inner surface area of the extended partial opening and via opening. The integrated circuit having the place-efficient capacitor can be integrated into a multi-level metallization package. Thereafter, standard processes may be used to complete fabrication and packaging of the integrated circuit.

From the foregoing, it is to be appreciated that the integrated circuit having a place-efficient capacitor fabricated in accordance with exemplary embodiments achieves significantly higher capacitance per unit area on the integrated circuit. The effective area between the capacitor electrodes is increased, enabling more efficient use of the chip area, particularly useful for high density DRAM arrays. The effective capacitor area is increased without occupying more chip space by increasing the surface area of the dielectric layer between the capacitor electrodes. A higher number of semiconductor devices may be integrated on a given area of the integrated circuit or higher capacitance can be achieved for a single semiconductor device.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An integrated circuit having a place-efficient capacitor comprising:
   a lower capacitor electrode having a surface area comprising an inner surface area of both a partial opening and a via opening formed in a patterned dielectric layer on a semiconductor substrate, wherein:
   the inner surface area of the partial opening is comprising a first portion and a second portion,
   the via opening separates the first portion from the second portion,
   the via opening is formed over a conductive feature,
   the via opening extends downward from the partial opening toward the conductive feature in a direction perpendicular to a surface of the semiconductor substrate and for a first length sufficiently long that at least of portion of the lower capacitor electrode in the via opening is in direct contact with the conductive feature,
   the first portion and the second portion each comprises a substrate-parallel surface that is parallel to the surface of the semiconductor substrate,
   the patterned dielectric layer comprises a patterned porosity,
   the patterned porosity comprises at least one extended opening that extends downward from the substrate-parallel surface of the first portion and parallel to the via opening and at least one extended opening that extends downward from the substrate-parallel surface of the second portion and parallel to the via opening, and
   each of the at least one extended openings extends downward for a second length that is insufficiently long to allow any portion of the lower capacitor electrode therein to directly contact the conductive feature;

a capacitor insulating layer overlying the lower capacitor electrode; and an upper capacitor electrode comprising a metal fill material filling a remaining portion of the partial opening and the via opening and having a surface area comprising the inner surface area of an outer surface of the capacitor insulating layer.

2. The integrated circuit of claim 1, wherein the patterned dielectric layer comprises an interlayer dielectric (ILD) layer.

3. The integrated circuit of claim 1, wherein the conductive feature comprises copper, tungsten, aluminum, silver, or gold.

4. The integrated circuit of claim 1, wherein the conductive feature is connected to a metal line, a via, a contact plug, or a silicide region.

5. The integrated circuit of claim 1, wherein the lower capacitor electrode comprises a first conductive layer overlying the patterned dielectric layer.

6. The integrated circuit of claim 5, wherein the first conductive layer comprises a diffusion barrier layer.

7. The integrated circuit of claim 5, wherein the first conductive layer has a thickness of about 5 nm to about 20 nm.

8. The integrated circuit of claim 5, wherein the first conductive layer comprises titanium or titanium-nitride.

9. The integrated circuit of claim 1, wherein the upper capacitor electrode comprises a second conductive layer overlying the patterned dielectric layer.

10. The integrated circuit of claim 9, wherein the second conductive layer comprises copper, silver, tungsten, gold, or aluminum.

11. The integrated circuit of claim 10, wherein the second conductive layer consists of a single metal layer.

12. The integrated circuit of claim 10, wherein the second conductive layer comprises two or more metal layers.

13. The integrated circuit of claim 1, wherein the upper capacitor electrode overlies the capacitor insulating layer.

* * * * *